(12) United States Patent
Di et al.

(10) Patent No.: US 11,121,068 B2
(45) Date of Patent: Sep. 14, 2021

(54) ARRAY SUBSTRATE, DISPLAY DEVICE, METHOD FOR MANUFACTURING THEM, AND SPLICED DISPLAY DEVICE

(71) Applicant: BOE Technology Group Co., Ltd., Beijing (CN)

(72) Inventors: Muxin Di, Beijing (CN); Zhiwei Liang, Beijing (CN); Yingwei Liu, Beijing (CN); Ke Wang, Beijing (CN); Zhanfeng Cao, Beijing (CN); Renquan Gu, Beijing (CN); Qi Yao, Beijing (CN); Jaiil Ryu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 16/530,605

(22) Filed: Aug. 2, 2019

(65) Prior Publication Data

US 2020/0273786 A1    Aug. 27, 2020

(30) Foreign Application Priority Data

Feb. 27, 2019  (CN) .......................... 201910146844.X

(51) Int. Cl.
*H01L 23/498*    (2006.01)
*H01L 21/48*    (2006.01)

(52) U.S. Cl.
CPC ...... *H01L 23/49827* (2013.01); *H01L 21/481* (2013.01); *H01L 21/486* (2013.01); *H01L 23/49894* (2013.01)

(58) Field of Classification Search
CPC ................................................ H01L 23/49827
See application file for complete search history.

(56) References Cited

U.S. PATENT DOCUMENTS

| 7,008,821 B1 | 3/2006 | Shao et al. |
| 9,275,934 B2 | 3/2016 | Sundaram et al. |
| 9,991,215 B1* | 6/2018 | Lin ................... H01L 21/76898 |

(Continued)

FOREIGN PATENT DOCUMENTS

| CN | 102884870 A | 1/2013 |
| CN | 102947931 A | 2/2013 |

(Continued)

OTHER PUBLICATIONS

First Office Action, including Search Report, for Chinese Patent Application No. 201910146844.X, dated Apr. 8, 2020, 13 pages.

(Continued)

*Primary Examiner* — Douglas M Menz
(74) *Attorney, Agent, or Firm* — Westman, Champlin & Koehler, P.A.

(57) ABSTRACT

Embodiments of the present disclosure provide an array substrate, a display device, a method for manufacturing an array substrate, a method for manufacturing a display device, and a spliced display device. The array substrate includes: a base substrate in which a through hole is provided; a filling portion disposed in the through hole, including a recessed structure and made from a flexible material; an electrically conductive pattern disposed on the filling portion and at least partially located in the recessed structure; and a film layer disposed on a side of the electrically conductive pattern facing away from the base substrate.

17 Claims, 5 Drawing Sheets

(56) References Cited

U.S. PATENT DOCUMENTS

| | | | |
|---|---|---|---|
| 10,672,718 B2 | 6/2020 | Sundaram et al. | |
| 2005/0121768 A1* | 6/2005 | Edelstein | H01L 21/76898 |
| | | | 257/698 |
| 2006/0057775 A1 | 3/2006 | Shao et al. | |
| 2011/0248405 A1 | 10/2011 | Li et al. | |
| 2012/0261805 A1* | 10/2012 | Sundaram | H01L 23/147 |
| | | | 257/666 |
| 2013/0119555 A1 | 5/2013 | Sundaram et al. | |
| 2016/0141257 A1 | 5/2016 | Sundaram et al. | |
| 2020/0106031 A1 | 4/2020 | Zhang et al. | |

FOREIGN PATENT DOCUMENTS

| | | |
|---|---|---|
| CN | 106158918 A | 11/2016 |
| CN | 109300947 A | 2/2019 |
| TW | 200610119 A | 3/2006 |

OTHER PUBLICATIONS

Second Office Action, including search, for Chinese Patent Application No. 201910146844.X, dated Oct. 30, 2020, 13 pages.

\* cited by examiner

ARRAY SUBSTRATE, DISPLAY DEVICE, METHOD FOR MANUFACTURING THEM, AND SPLICED DISPLAY DEVICE

CROSS-REFERENCE TO RELATED APPLICATION

This application claims priority of Chinese Patent Application No. 201910146844.X filed on Feb. 27, 2019 in China National Intellectual Property Administration, the disclosure of which is incorporated herein by reference in entirety.

TECHNICAL FIELD

Embodiments of the present disclosure relate to the field of display technology, and in particular, to an array substrate, a display device, a method for manufacturing an array substrate, a method for manufacturing a display device, and a spliced display device.

BACKGROUND

Full-screen display devices are favored by consumers because of its high screen-to-body ratio. Currently, GOA (Gate Driver On Array) technology is used to narrow the left and right bezels, and COF (Chip On Film) technology is used to narrow the lower bezel. However, no matter whether it is GOA technology or COF technology, the display device still has a bezel. At present, TGV (Through Glass Via) technology has received wide attention due to the fact that the TGV technology can achieve ultra-narrow bezel or no bezel.

SUMMARY

In a first aspect, there is provided an array substrate, comprising:
a base substrate in which a through hole is provided;
a filling portion disposed in the through hole, comprising a recessed structure and made from a flexible material;
an electrically conductive pattern disposed on the filling portion and at least partially located in the recessed structure; and
a film layer disposed on a side of the electrically conductive pattern facing away from the base substrate.

In some embodiments of the present disclosure, the base substrate is made from a rigid material.

In some embodiments of the present disclosure, the recessed structure has a depth less than or equal to a thickness of the filling portion.

In some embodiments of the present disclosure, the electrically conductive pattern is of a single-layer structure, and the electrically conductive pattern is made from copper; or the electrically conductive pattern is of a three-layer laminated structure, an intermediate layer of the three-layer laminated structure is made from aluminum, and other two layers on both sides of the intermediate layer are made from titanium.

In some embodiments of the present disclosure, the array substrate further comprises a connecting portion disposed on a side of the base substrate facing away from the electrically conductive pattern;
wherein the connecting portion is electrically connected to the electrically conductive pattern.

In some embodiments of the present disclosure, the connecting portion is located in the recessed structure to be electrically connected to the electrically conductive pattern.

In some embodiments of the present disclosure, the connecting portion is not located in the recessed structure, and a surface of the connecting portion close to the film layer, a surface of the electrically conductive pattern facing away from the film layer, and a surface of the recessed structure facing away from the film layer are all located in a same plane as a surface of the base substrate facing away from the film layer.

In some embodiments of the present disclosure, the rigid material is selected from glass, plastic, ceramic or quartz, and the flexible material is selected from poly-p-xylylene or polyimide.

In a second aspect, there is provided a display device, comprising the array substrate according to any one of the above embodiments,
wherein the display device further comprises a chip disposed on a side of the connecting portion in the array substrate facing away from the base substrate, the chip being electrically connected to the connecting portion.

In a third aspect, there is provided a spliced display device, comprising a plurality of the display devices according to any one of the above embodiments.

In a fourth aspect, there is provided a method for manufacturing an array substrate, comprising:
forming a through hole in a base substrate;
filling a flexible material in the through hole, processing the flexible material filled in the through hole to form a filling portion, the filling portion comprising a recessed structure;
forming an electrically conductive pattern on the filling portion, the electrically conductive pattern being at least partially located in the recessed structure; and
forming a film layer on a side of the electrically conductive pattern facing away from the base substrate.

In some embodiments of the present disclosure, the forming a through hole in the base substrate comprises:
modifying a through hole region where a through hole is to be formed on the base substrate such that the through hole region is more easily etched by an etching solution than other regions on the base substrate; and
placing the base substrate in the etching solution, and forming the through hole in the through hole region by etching using the etching solution.

In some embodiments of the present disclosure, before placing the base substrate in the etching solution, the forming a through hole in the base substrate further comprises:
forming an anti-etching protective film on a side of the base substrate.

In some embodiments of the present disclosure, the through hole region is irradiated by laser to modify the through hole region.

In some embodiments of the present disclosure, the forming a through hole in the base substrate comprises:
forming an anti-etching protective film on at least one side of opposite sides of the base substrate in a region other than a through hole region where a through hole is to be formed; and
placing the base substrate in an etching solution, and forming the through hole in the through hole region by etching using the etching solution.

In some embodiments of the present disclosure, before placing the base substrate in the etching solution, the forming a through hole in the base substrate further comprises:
modifying the through hole region on the base substrate such that the through hole region is more easily etched by the etching solution than other regions on the base substrate.

In some embodiments of the present disclosure, the forming an electrically conductive pattern on the filling portion comprises:

forming an electrically conductive film on the filling portion by sputtering, and patterning the electrically conductive film to form the electrically conductive pattern.

In some embodiments of the present disclosure, after forming the electrically conductive pattern, the method further comprises removing the electrically conductive pattern outside the recessed structure by a chemical mechanical polishing process.

In a fifth aspect, there is provided a method for manufacturing a display device, comprising:

providing the array substrate according to any one of the above embodiments;

forming a connecting portion on a side of the base substrate of the array substrate facing away from the film layer, and electrically connecting the connecting portion to the electrically conductive pattern;

bonding a chip to a side of the connecting portion facing away from the base substrate, and electrically connecting the chip to the connecting portion.

In some embodiments of the present disclosure, the recessed structure has a depth less than a thickness of the filling portion, and the method further comprises: etching through the recessed structure from a side of the base substrate of the array substrate facing away from the film layer to expose the electrically conductive pattern.

BRIEF DESCRIPTION OF THE DRAWINGS

In order to more clearly illustrate the technical solutions of the embodiments of the present disclosure or in the related art, the accompanying drawings to be used in the description of the embodiments of the present disclosure or in the related art will be briefly described below. It is apparent that the drawings in the following description only reflect some embodiments of the present disclosure, and other drawings may also be obtained by those skilled in the art based on these drawings without any creative efforts.

DETAILED DESCRIPTION OF EMBODIMENTS

Figure 1:
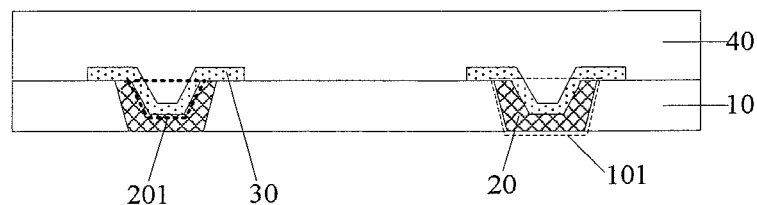
FIG. 1 is a schematic structural view of an array substrate according to an embodiment of the present disclosure.

The technical solutions in the embodiments of the present disclosure will be clearly and completely described below with reference to the accompanying drawings in the embodiments of the present disclosure. It is apparent that the described embodiments represent a part of those in the present disclosure, but not all of the embodiments. All other embodiments obtained by those skilled in the art based on the embodiments of the present disclosure without any creative efforts fall within the scope of the present disclosure.

In the TGV technology, a manufacturing process of a TGV substrate is as follows: firstly, a through hole is formed in a base substrate, and then copper (Cu) is formed in the through hole by an electroplating process. Since the copper is also formed around the through hole by the electroplating process during the copper electroplating process in the through hole and the copper-electroplated surface is not flat, it is necessary to remove the copper around the through hole by a chemical mechanical polishing (CMP) process, leaving only the copper in the through hole. After the TGV substrate is manufactured, film layers for display need to be formed on the TGV substrate to form an array substrate. After the display panel is manufactured, a chip (such as an integrated circuit (IC)) is bonded to a back side of the array substrate so that the chip is electrically connected to the copper in the through hole in the base substrate of the TGV substrate.

The designer has found that, in the case where the TGV technology (namely, making a through hole in a rigid base substrate, for example, making a through hole in glass, and filling the through hole with an electrically conductive material) is used in the related processes, since thermal expansion coefficients of the glass and the electrically conductive material filled in the through hole of the glass in subsequent high-temperature processes are different, it causes the glass and the electrically conductive material formed in the through hole of the glass to have a large step difference (about several hundred micrometers) when heated and expanded. The thickness of each sub-film layer formed on the surface of the TGV substrate is small (less than 1 micron), therefore it is difficult to form a thin and continuous film layer on the TGV substrate by sputtering or plasma enhanced chemical Vapor Deposition (PECVD), or the film layer formed on the TGV substrate is easily broken after several high-temperature processes. In addition, under high temperature conditions, when the glass and the electrically conductive material are heated and expanded, there is a gap at the boundary between the glass and the electrically conductive material, thus the film layer formed on the TGV substrate may be broken, thereby adversely affecting the display. In the case where the TPV (Trough Polyimide Via, i.e., making a through hole in a flexible base substrate and filling the through hole with an electrically conductive material) is used, the material of the flexible base substrate may be polyimide (PI), and the flexible base substrate needs to be first disposed on a rigid substrate to ensure the implementation of the subsequent processes, and then the flexible base substrate is stripped from the rigid substrate. Since the electrically conductive material in the through hole is usually a metal material, for example copper, it is difficult to completely strip the flexible base substrate from the rigid substrate. Moreover, since the flexible base substrate is relatively soft and has poor heat resistance, performing a bonding process on a back side of the array substrate is more difficult.

Embodiments of the present disclosure provide an array substrate, a display device, a method for manufacturing an array substrate, a method for manufacturing a display device, and a spliced display device, which can solve the problem of breakage of film layer formed on a base substrate when the base substrate is made from a rigid material, and the problem of significant difficulty of striping of a base substrate from a rigid substrate and the problem of significant difficulty of bonding process when the base substrate is made from a flexible material.

Figure 2:
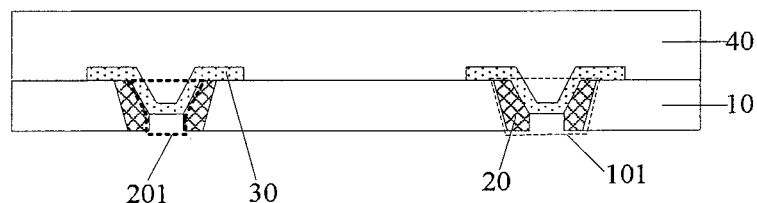
FIG. 2 is a schematic structural view of an array substrate according to an embodiment of the present disclosure.

Based on this, in an embodiment of the present disclosure, it provides an array substrate, as shown in FIG. 1 and FIG. 2, including: a base substrate 10 in which a through hole 101 is provided, the base substrate 10 being made from a rigid material; a filling portion 20 disposed in the through hole 101, including a recessed structure 201 and made from a flexible material; an electrically conductive pattern 30 disposed on the filling portion 20 and at least partially located in the recessed structure 201; and a film layer 40 disposed on a side of the electrically conductive pattern 30 facing away from the base substrate 10.

Herein, the rigid material refers to a material that does not deform under the action of an external force or whose deformation may be negligible under the action of an external force. By way of example, the rigid material may be glass, plastic, ceramic, quartz or the like. In some embodiments of the present disclosure, the material of the base substrate 10 is glass. In this case, the through hole 101 may also be referred to as a TG (Through Glass) hole. The flexible material refers to a material that deforms under the action of an external force with respect to the rigid material. By way of example, the flexible material may be poly-p-xylylene or polyimide. In some embodiments of the present disclosure, the flexible material is polyimide.

In some embodiments, as shown in FIG. 2, the recessed structure 201 is a through hole, that is, the recessed structure 201 runs through the filling portion 20 completely. As an example, an outer contour of the filling portion 20 has an inverted truncated cone shape, that is, the upper surface of the truncated cone has an area greater than that of the lower surface. The recessed structure 201 is a through hole extending in the filling portion 20, and the through hole may be of a truncated cone shape corresponding to the outer contour of the filling portion 20, or alternatively, the through hole may include a first portion and a second portion located above the first portion, the first portion being cylindrical and the second portion being of an inverted truncated cone shape, and the lower surface of the inverted truncated cone of the second portion is in contact with the upper surface of the cylinder of the first portion. In other embodiments, as shown in FIG. 1, the recessed structure 201 is a blind hole, that is, the recessed structure 201 partially runs through the filling portion 20. As an example, an outer contour of the filling portion 20 has an inverted truncated cone shape, that is, the upper surface of the truncated cone has an area greater than that of the lower surface. The recessed structure 201 is a through hole having a contour of an inverted truncated cone shape. If the recessed structure is a blind hole, the depth of the hole is less than the thickness of the filling portion. If the recessed structure is a through hole, the depth of the hole is equal to the thickness of the filling portion. Herein, the depth of the hole refers to a dimension in a direction perpendicular to a plane where the base substrate is located, and the thickness of the filling portion refers to a dimension in a direction perpendicular to the plane where the base substrate is located.

Herein, the structure and material of the electrically conductive pattern 30 are not limited. In some embodiments, the electrically conductive pattern 30 is of a single-layer structure, and the electrically conductive pattern 30 is made from copper. In other embodiments, the electrically conductive pattern 30 is of a multilayer laminated structure, for example, a three-layer laminated structure including an intermediate layer of aluminum (Al) and two film layers located on both sides of the intermediate layer and made from titanium (Ti).

On this basis, the film layer 40 disposed on the electrically conductive pattern 30 is not limited. In some embodiments, the film layer 40 is of a single-layer structure. In other embodiments, the film layer 40 comprises a multilayer structure. For example, the film layer 40 includes thin film transistors, gate lines, data lines, a planarization layer provided on the thin film transistors, and the like. The thin film transistor includes a source electrode, a drain electrode, an active layer, a gate electrode, and a gate insulating layer. If the array substrate is applied to a Micro-LED (Micro Light-Emitting Diode) display device, the film layer 40 further includes a connection electrode on a surface of the array substrate, and the connection electrode is bonded to a pin of a Micro-LED (also referred to as a u-LED or Mini-LED) particle. In some embodiments, the connection electrode comprises a two-layer laminated structure, one layer of ITO (Indium Tin Oxides) material and the other layer of Ag (Argentine) material. If the array substrate is applied to a liquid crystal display (LCD), the film layer 40 further includes a pixel electrode, or a pixel electrode and a common electrode. If the array substrate is applied to an electroluminescence display device, the film layer 40 further includes an anode, a cathode, and a light-emitting functional layer disposed between the anode and the cathode.

It should be understood that, traces on the array substrate are electrically connected to the electrically conductive pattern 30. In the case where the array substrate is applied to a display device, a chip is provided on a side of the base substrate 10 facing away from the electrically conductive pattern 30, the electrically conductive pattern 30 is bonded to the chip, and thus the traces on the array substrate are bonded to the chip. Since the chip is disposed on the back side of the array substrate (i.e., the side of the base substrate 10 facing away from the electrically conductive pattern 30), the space in the front side of the array substrate (i.e., the side of the base substrate 10 close to the electrically conductive pattern 30) is not occupied. Thus, an ultra-narrow bezel or no bezel can be realized, thereby increasing the display area.

In an embodiment of the present disclosure, it provides an array substrate including a base substrate 10 and a filling portion 20. The base substrate 10 is provided with a through hole 101, the filling portion 20 is disposed in the through hole 101, and the filling portion 20 includes a recessed structure 201. The array substrate further includes an electrically conductive pattern 30 disposed on the filling portion 20, the electrically conductive pattern 30 is at least partially located in the recessed structure 201, the material of the base substrate 10 is a rigid material, and the material of the filling portion 20 is a flexible material. In the manufacturing process of the array substrate, even the base substrate 10 and the electrically conductive pattern 30 are expanded under high temperature conditions, no gap is formed among the electrically conductive pattern 30, the filling portion 20 and the base substrate 10 since the material of the filling portion 20 between the electrically conductive pattern 30 and the base substrate 10 is a flexible material. In addition, since there is no flexible material filled in the through hole 101 but rather the through hole is entirely filled with an electrically conductive pattern for example copper in the related art, if the electrically conductive pattern is heated and expanded under high temperature conditions, a large step difference would be formed between the electrically conductive pattern and the base substrate 10. In contrast, in the embodiments of the present disclosure, the filling portion 20 is disposed in the through hole 101, and the electrically conductive pattern 30 is disposed on the recessed structure 201 of the filling portion 20, thus the volume of the electrically conductive pattern 30 in the embodiments of the present disclosure is smaller than that in the related art. Therefore, when the base substrate 10 and the electrically conductive pattern 30 are expanded under high temperature conditions, the step difference between the base substrate 10 and the electrically conductive pattern 30 is small. Based on the above, the embodiments of the present disclosure can reduce the risk of breakage of the film layer 40 disposed on the electrically conductive pattern 30.

On this basis, the material of the base substrate 10 in the embodiments of the present disclosure is a rigid material, thus it is unnecessary to dispose the base substrate 10 on a rigid substrate and then strip it from the rigid substrate subsequently, and the chip is easily bonded to the back side of the array substrate (i.e., performing the bonding process), thereby avoiding the problem of significant difficulty of striping of the base substrate 10 from a rigid substrate and the problem of significant difficulty of bonding process when the base substrate 10 is made from a flexible material.

Figure 3:
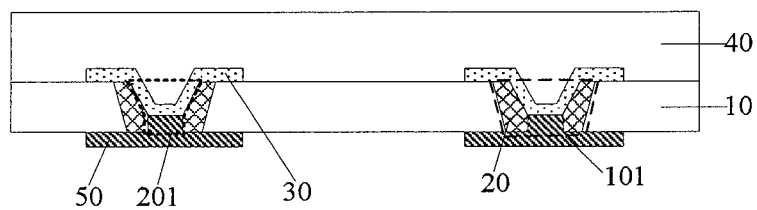
FIG. 3 is a schematic structural view of an array substrate according to an embodiment of the present disclosure.

In the case where the recessed structure 201 is a through hole, as shown in FIG. 3, the array substrate further includes a connecting portion (for example, a PAD) 50 disposed on a side of the base substrate 10 facing away from the electrically conductive pattern 30. The connecting portion 50 extends through the recessed structure 201 of the filling portion 20 and is electrically connected to the electrically conductive pattern 30.

Herein, the material of the connecting portion 50 and the material of the electrically conductive pattern 30 may be the same or different, which is not limited in the present disclosure.

In some embodiments, as shown in FIG. 3, a part of the connecting portion 50 corresponding to the recessed structure 201 is located in the recessed structure 201. As an example, an outer contour of the filling portion 20 has an inverted truncated cone shape, that is, the upper surface of the truncated cone has an area greater than that of the lower surface. The recessed structure 201 is a through hole extending in the filling portion 20, the through hole may include a first portion and a second portion located above the first portion, the first portion being cylindrical and the second portion being of an inverted truncated cone shape, and the lower surface of the inverted truncated cone of the second portion is in contact with the upper surface of the cylinder of the first portion. The electrically conductive pattern 30 extends into the second portion of the through hole, the connecting portion 50 includes a base portion and a raised portion on the base portion, the raised portion extending into the first portion of the through hole. In other embodiments, the bottom of the electrically conductive pattern 30 is in the same plane as the bottom of the recessed structure 201, that is, the connecting portion 50 is not located in the recessed structure 201, the top of the connecting portion 50, the bottom of the electrically conductive pattern 30, and the bottom of the recessed structure 201 are all in the same plane as the surface of the base substrate 10.

In some embodiments of the present disclosure, the array substrate includes a connecting portion 50 disposed on a side of the base substrate 10 facing away from the electrically conductive pattern 30. Thus, when the array substrate is applied to a display device, a chip may be provided on a side of the connecting portion 50 facing away from the base substrate 10, and the chip is electrically connected to the connecting portion 50. Since the connecting portion 50 extends through the recessed structure 201 of the filling portion 20 and is electrically connected to the electrically conductive pattern 30, the chip can be electrically connected to the electrically conductive pattern 30.

Figure 4:
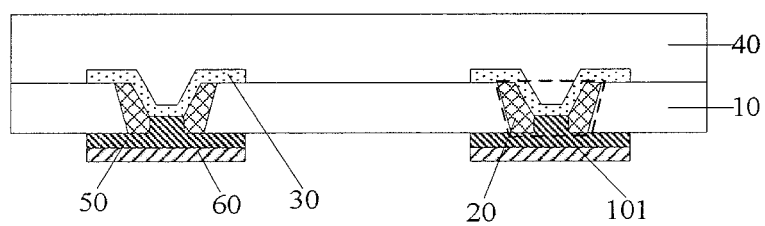
FIG. 4 is a schematic structural view of a display device according to an embodiment of the present disclosure.

In an embodiment of the present disclosure, it provides a display device 01, as shown in FIG. 4, including the above array substrate. The connecting portion 50 in the above array substrate extends through the recessed structure 201 and is electrically connected to the electrically conductive pattern 30. The display device further includes a chip 60 on a side of the connecting portion 50 disposed in the array substrate facing away from the base substrate 10, and the chip 60 is electrically connected to the connecting portion 50.

The type of the display device is not limited in the present disclosure. In some embodiments, the display device is a liquid crystal display device. In the case where the display device is a liquid crystal display device, the display device further includes an opposite substrate and a liquid crystal layer disposed between the opposite substrate and the array substrate. When the opposite substrate includes a color filter layer, the opposite substrate may also be referred to as a color filter substrate. In other embodiments, the display device is an electroluminescence display device. When the display device is an electroluminescence display device, the display device may be an organic light-emitting diode (OLED) or a quantum dot light-emitting diode (QLED); of course, it can also be a Micro-LED display device. In the case where the display device is an organic electroluminescence display device or a quantum dot electroluminescence display device, the display device further includes a package layer disposed on the array substrate. Herein, the package layer may be a package substrate or a package film. In the case where the display device is a Micro-LED display device, the display device further includes a plurality of Micro-LED particles disposed on the film layer 40 of the array substrate, the film layer 40 includes connection electrodes on the surface of the array substrate, and one pin of each Micro-LED particle is bonded to one of the connection electrodes. In other embodiments, the display device is a photoluminescence display device. The photoluminescence display device may be, for example, a quantum dot photoluminescence display device. In the case where the display device is a quantum dot photoluminescence display device, the display device further includes a package layer disposed on the array substrate. Herein, the package layer may be a package substrate or a package film.

Here, the traces disposed on the front side of the array substrate (i.e., the side of the electrically conductive pattern 30 facing away from the base substrate 10) may be electrically connected to the electrically conductive pattern 30, the electrically conductive pattern 30 is electrically connected to the connecting portion 50, and the chip 60 is electrically connected to the connecting portion 50, therefore the traces are made to be electrically connected to the chip 60, thereby bonding the traces to the chip 60.

In the embodiments of the present disclosure, it provides a display device including the above array substrate. The array substrate in the display device has the same structure and beneficial effects as the array substrate provided in the above embodiments. Since the structure and beneficial effects of the array substrate have been described in detail in the above embodiments, they will not be described again here.

On the basis of this, since the chip 60 in the display device is disposed on the side of the connecting portion 50 facing away from the base substrate 10, that is, disposed on the back side of the array substrate, it prevents the chip 60 from occupying the space in the front side of the array substrate (i.e., the side of the base substrate 10 close to the electrically conductive pattern 30). Therefore, the display device can realize a design of an ultra-narrow bezel or no bezel, which increases the display area of the display device.

Figure 5:
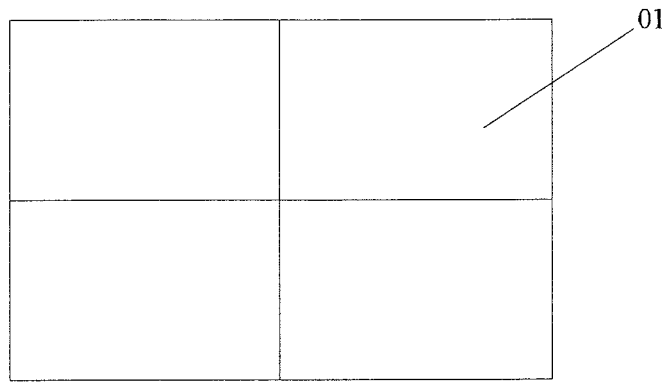
FIG. 5 is a schematic structural view of a spliced display device according to an embodiment of the present disclosure.

In an embodiment of the present disclosure, it provides a spliced display device, as shown in FIG. 5, including a plurality of the above-described display devices 01.

Here, the number of the display devices 01 in the spliced display device is not limited, and it may be set as needed. In FIG. 5, a splicing display device including four display devices 01 is taken as an example.

In the embodiments of the present disclosure, since the chip 60 of each display device in the spliced display device is bonded to the back side of the array substrate (i.e., the side of the base substrate 10 facing away from the electrically conductive pattern 30), each display device in the spliced display device can realize a design of an ultra-narrow bezel or no bezel, thereby the spliced display device can realize a full-screen display.

Figure 6:
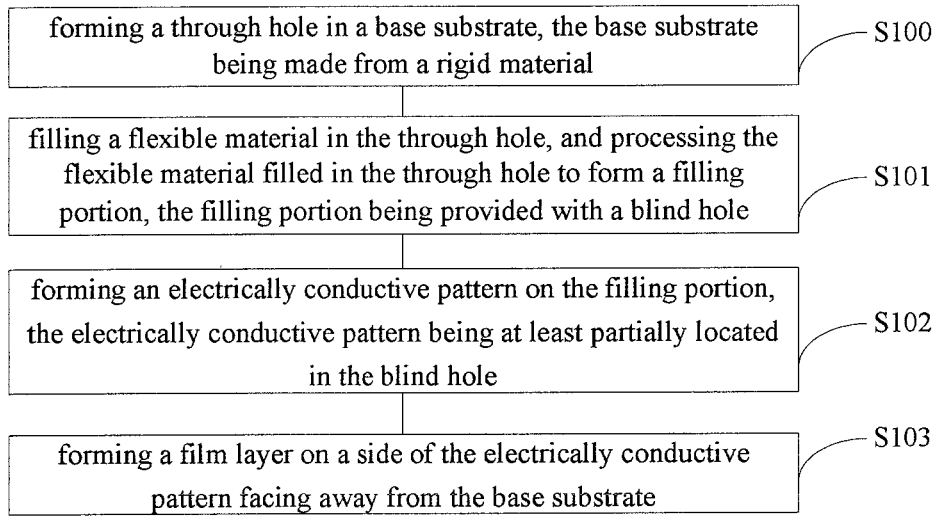
FIG. 6 is a schematic flow chart of a method for manufacturing an array substrate according to an embodiment of the present disclosure.

In an embodiment of the present disclosure, it provides a method for manufacturing an array substrate, as shown in FIG. 6, the method includes steps S100, S101, S102, and S103.

Figure 7A:
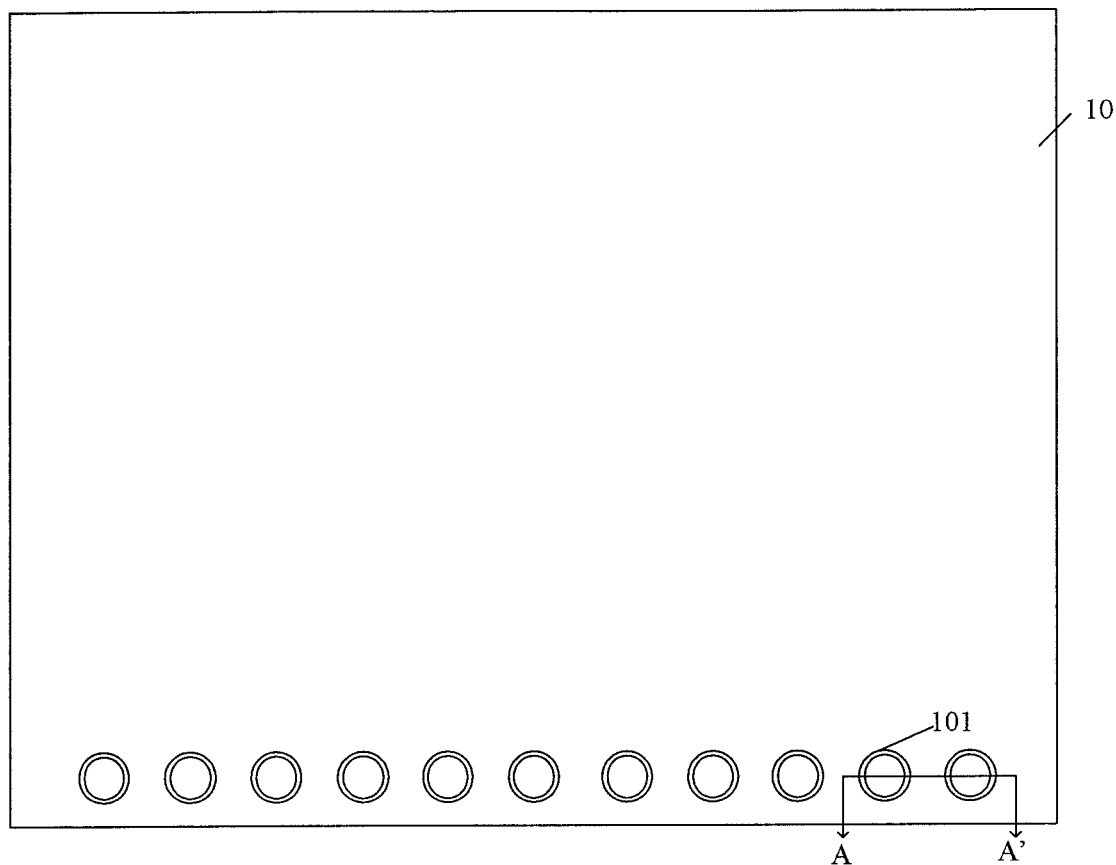
FIG. 7a and FIG. 7b illustrate an example of a step of forming a through hole in a base substrate.
Figure 7B:
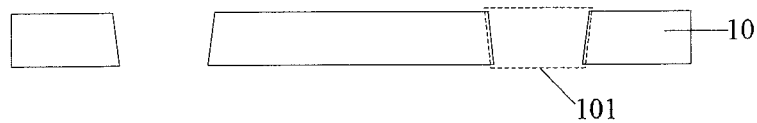

S100: as shown in FIG. 7a and FIG. 7b, forming a through hole 101 in a base substrate 10, the base substrate 10 being made from a rigid material. FIG. 7a is a top view of the base substrate 10 formed with a plurality of through holes 101 therein, and FIG. 7b is a cross-section view of the same base substrate along a AA' line passing through a central axis of two of the plurality of the through hole 101.

In some embodiments, the rigid material is glass. In this case, the through hole 101 may also be referred to as a TG (Through Glass) hole.

On the basis of this, the number, shape, and size of the through holes 101 are not particularly limited, and it may be set as needed.

Here, the manner in which the through hole 101 is formed in the base substrate 10 is not limited. Two specific implementations are provided below.

In a first implementation manner, the forming the through hole 101 in the base substrate 10 includes:

S200: modifying a through hole region where a through hole is to be formed on the base substrate 10 such that the through hole region is more easily etched by an etching solution than other regions on the base substrate 10.

In some embodiments, the through hole region where a through hole is to be formed may be irradiated by laser to modify the through hole region.

S201: placing (immersing) the base substrate 10 in the etching solution, and forming, by etching, the through hole 101 in the through hole region using the etching solution.

The etching solution is not limited in the present disclosure, and the etching solution may be selected according to the material of the base substrate 10. For example, in the case where the base substrate 10 is made from glass, the etching solution is a HF (hydrofluoric acid) solution.

Here, the time for placing the base substrate 10 in the etching solution is not limited as long as the through hole 101 may be formed in the through hole region. The time during which the base substrate 10 is placed in the etching solution may be selected according to the thickness of the base substrate 10 and the concentration of the etching solution.

It should be noted that, since the through hole region on the base substrate 10 is modified, the through hole region is more easily etched by the etching solution than other regions on the base substrate 10. Thus, when the base substrate 10 is placed in the etching solution, the etching rate of the through hole region etched by the etching solution is greater than the etching rate of other regions on the base substrate 10 etched by the etching solution, and therefore the through hole 101 is formed in the through hole region.

Figure 8:
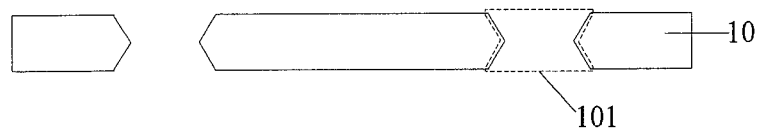
FIG. 8 illustrates another example of the step of forming a through hole in a base substrate.
Figure 9:
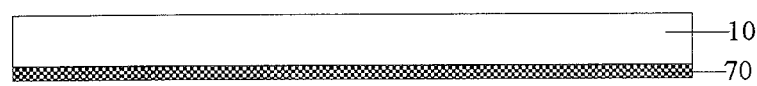
FIG. 9 illustrates forming an anti-etching protective film on a side of a base substrate.

In view of the fact that the etching solution etches the base substrate 10 from both sides of the base substrate 10 when the base substrate 10 is placed in the etching solution, as shown in FIG. 8, the formed through hole 101 is small in the middle and large on both sides along the depth direction of the through hole 101. If the formed through hole 101 is small in the middle and large on both sides, it would be not easy to fill the through hole 101 with a flexible material. Based on this, in some embodiments, before the step S201, the forming the through hole 101 in the base substrate 10 further includes forming an anti-etching protective film 70 on one side of the base substrate 10, as shown in FIG. 9.

It should be noted that, in the case where the anti-etching protective film 70 is formed on one side of the base substrate 10, in some embodiments, the anti-etching protective film 70 formed on one side of the base substrate 10 is stripped off after the step S201; in other embodiments, the anti-etching protective film 70 formed on one side of the base substrate 10 is kept after the step S201. In the case where the anti-etching protective film 70 formed on one side of the base substrate 10 is kept and the chip is bonded to the back side of the array substrate, the anti-etching protective film 70 should be patterned so that the anti-etching protective film 70 is hollowed out corresponding to the position of the through hole 101, in order not to affect the bonding of the chip. On the basis of this, in the case where the anti-etching protective film 70 formed on one side of the base substrate 10 is kept, the material of the selected anti-etching protective film 70 should not affect the performance of the array substrate.

Here, the anti-etching protective film 70 may be formed on one side of the base substrate 10 before the step S200; or the anti-etching protective film 70 may be formed on one side of the base substrate 10 after the step S200 and before the step S201.

Further, the material of the anti-etching protective film 70 may be, for example, paraffin wax or photoresist.

In the embodiments of the present disclosure, since one side of the base substrate 10 is formed with the anti-etching protective film 70, the anti-etching protective film 70 can prevent the base substrate 10 from being etched. Thus, when the base substrate 10 on which the anti-etching protective film 70 is formed is placed in the etching solution, the etching solution can only etch the base substrate 10 from the side where the anti-etching protective film 70 is not formed, and the etching rate of the through hole region etched by the etching solution is greater than the etching rate of other regions on the base substrate 10 etched by the etching solution, therefore the through hole region is etched to form the through hole 101, while the other regions are thinned, and the size of the formed through hole 101 is gradually reduced along the depth direction of the through hole 101, as shown in FIG. 7b. In the case where the size of the through hole 101 is gradually reduced along the depth direction of the through hole 101, it is convenient to fill the through hole 101 with a flexible material.

Figure 10:
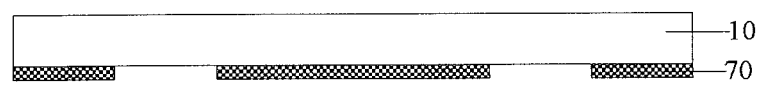
FIG. 10 illustrates forming an anti-etching protective film on a side of a base substrate in a region other than a through hole region where a through hole is to be formed.

In a second implementation manner, the forming the through hole 101 in the base substrate 10 includes:

S300: as shown in FIG. 10, forming an anti-etching protective film 70 on at least one side of opposite sides of the base substrate 10 in a region other than the through hole region where a through hole is to be formed.

Here, as shown in FIG. 10, the anti-etching protective film 70 may be formed on one side of the base substrate 10 in a region other than the through hole region where a through hole is to be formed; or alternatively, anti-etching protective films 70 may be respectively formed on the opposite sides of the base substrate 10 in a region other than the through hole region where a through hole is to be formed.

The material of the anti-etching protective film 70 has been described in detail in the above embodiments, and thus it will not be described herein.

Figure 11:
FIG. 11 illustrates forming a through hole in a base substrate on which an anti-etching protective film is formed.

S301: as shown in FIG. 11, placing the base substrate 10 in an etching solution, and forming, by etching, the through hole 101 in the through hole region using the etching solution.

The etching solution and the time during which the base substrate 10 is placed in the etching solution have been described in detail in the above embodiments, and thus they will not be described herein.

It should be noted that, in the case where the anti-etching protective film 70 is formed on one side of the base substrate 10 in a region other than the through hole region where a through hole is to be formed, when the base substrate 10 is placed in the etching solution, the side of the base substrate where no anti-etching protective film 70 is formed is all in contact with the etching solution, thus the etching solution would completely etch the side of the base substrate where no anti-etching protective film 70 is formed, thereby thinning the base substrate 10, and the size of the formed through hole 101 is gradually reduced along the depth direction of the through hole 101, from the side of the base substrate 10 where the anti-etching protective film 70 is formed to the side of the base substrate where no anti-etching protective film 70 is formed.

After the step S301, in some embodiments, the anti-etching protective film 70 formed on the base substrate 10 is stripped off; in other embodiments, the anti-etching protective film 70 formed on the base substrate 10 is kept. In the case where the anti-etching protective film 70 formed on one side of the base substrate 10 is kept, the selected material of the anti-etching protective film 70 should not affect the performance of the array substrate.

In some embodiments, before the step S301, the forming the through hole 101 in the base substrate 10 further includes: modifying the through hole region where a through hole is to be formed on the base substrate 10 such that the through hole region is more easily etched by the etching solution than other regions on the base substrate 10.

Here, the through hole region on the base substrate 10 may be modified before the step S300; or the through hole region on the base substrate 10 may be modified after the step S300 and before the step S301.

In some embodiments, the through hole region where a through hole is to be formed may be irradiated by laser to modify the through hole region.

It should be noted that, since the through hole region on the base substrate 10 is modified, the through hole region is more easily etched by the etching solution than other regions on the base substrate 10. Thus, when the base substrate 10 is placed in the etching solution, the etching solution will rapidly etch the through hole region, thereby improving the efficiency of forming the through hole 101 in the base substrate 10.

Figure 12A:
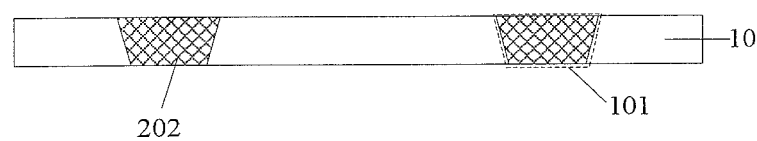
FIG. 12a illustrates filling a flexible material in a through hole.
Figure 12B:
FIG. 12b illustrates forming a filling portion in a through hole.

S101: as shown in FIG. 12a, filling a flexible material 202 in the through hole 101, and as shown in FIG. 12b, processing the flexible material 202 filled in the through hole 101 to form a filling portion 20, the filling portion 20 being provided with a blind hole.

In some embodiments, the flexible material 202 is polyimide.

There is no limitation on how to fill the flexible material 202 in the through hole 101. In some embodiments, the flexible material 202 is injected into the through hole 101 by means of a syringe needle. In the case where the fluidity of the flexible material 202 is good, the flexible material 202 may be coated over the through hole 101 to fill the through hole 101 with the flexible material 202. In the case where the fluidity of the flexible material 202 is poor, the flexible material 202 may be coated over the through hole 101, and the flexible material 202 may be sucked under the through hole 101, to fill the through hole 101 with the flexible material 202.

Here, after the flexible material 202 is filled in the through hole 101, a blind hole may be etched at the center of the flexible material 202 by dry etching. It should be noted that the thickness of the flexible material under the blind hole may be controlled by controlling the process parameters of the dry etching. In some embodiments of the present disclosure, the thickness of the flexible material under the blind hole may be kept thin within a controllable process range of the dry etching.

Figure 13:
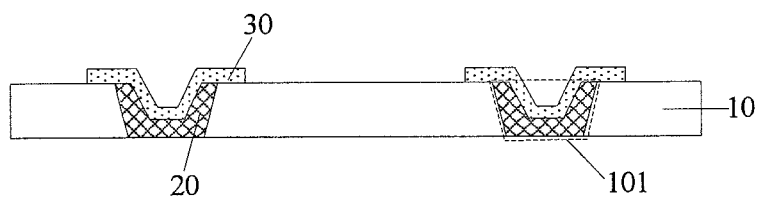
FIG. 13 illustrates forming an electrically conductive pattern on a filling portion.

S102: as shown in FIG. 13, forming an electrically conductive pattern 30 on the filling portion 20, the electrically conductive pattern 30 being at least partially located in the blind hole.

In some embodiments, the electrically conductive pattern 30 is of a single-layer structure, and the electrically conductive pattern 30 is made from copper. In other embodiments, the electrically conductive pattern 30 is of a multi-layer laminated structure, for example, a three-layer laminate structure including an intermediate layer of aluminum and two film layers located on both sides of the intermediate layer and made from titanium.

In some embodiments, the step S102 includes: forming the electrically conductive pattern 30 in the through hole by using an electroplating process. When the electrically conductive pattern 30 is formed in the blind hole by the electroplating process, the electrically conductive pattern 30 is also formed around the blind hole, and the electroplating process may cause unevenness of the surface of the formed electrically conductive pattern 30 and uncontrollable excess thickness of the electrically conductive pattern 30 formed. In order to avoid affecting the film layer formed on the electrically conductive pattern 30, it is necessary to use a chemical mechanical polishing process to remove the electrically conductive pattern 30 around the blind hole and the excess electrically conductive pattern 30 on the blind hole subsequently, leaving only the flat electrically conductive pattern 30 on the inner surface of the blind hole.

In other embodiments, the step S102 includes: forming an electrically conductive film on the filling portion 20 by sputtering, and patterning the electrically conductive film to form the electrically conductive pattern 30. Here, the patterning includes coating photoresist, exposure by mask, development, and etching processes. Since the flatness of the electrically conductive pattern 30 formed by the sputtering process is good, the electrically conductive pattern 30 may be formed only in the blind hole. Alternatively, as shown in FIG. 13, the electrically conductive pattern 30 may be formed both in the blind hole and around the blind hole.

In the embodiments of the present disclosure, on one hand, the sputtering process is relatively simple with respect to the electroplating process; on the other hand, the electrically conductive film formed by sputtering is relatively thin, therefore the electrically conductive pattern 30 formed after patterning the electrically conductive film is relatively thin. In this way, in the manufacturing process of the array substrate, even the electrically conductive pattern 30 and the base substrate 10 are expanded under high temperature conditions, the step difference between the electrically conductive pattern 30 and the base substrate 10 is small, therefore further preventing the film layer 40 formed on the base substrate 10 from being broken.

Figure 14:
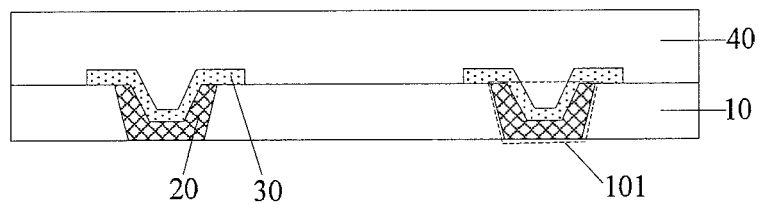
FIG. 14 illustrates forming a film layer on an electrically conductive pattern.

S103: as shown in FIG. 14, forming a film layer 40 on a side of the electrically conductive pattern 30 facing away from the base substrate 10.

The film layer 40 has been described in detail in the above embodiments, and it will not be described herein.

In the embodiments of the present disclosure, it provides a method for manufacturing an array substrate. The method for manufacturing the array substrate has the same structure and beneficial effects as the array substrate provided in the above embodiments. Since the structure and beneficial effects of the array substrate have been described in detail in the above embodiments, they will not be described again here.

In some embodiments, after the step S103, the method for manufacturing the array substrate further includes: as shown in FIG. 3, etching through the blind hole in the filling portion 20 from a side of the base substrate 10 of the array substrate facing away from the electrically conductive pattern 30 to expose the electrically conductive pattern 30; forming a connecting portion 50 on the side of the base substrate 10 of the array substrate facing away from the electrically conductive pattern 30, the connecting portion 50 extending through the filling portion 20 and being electrically connected to the electrically conductive pattern 30.

The method for manufacturing the array substrate provided by the embodiments of the present disclosure can be used to manufacture the above array substrate.

Figure 15:
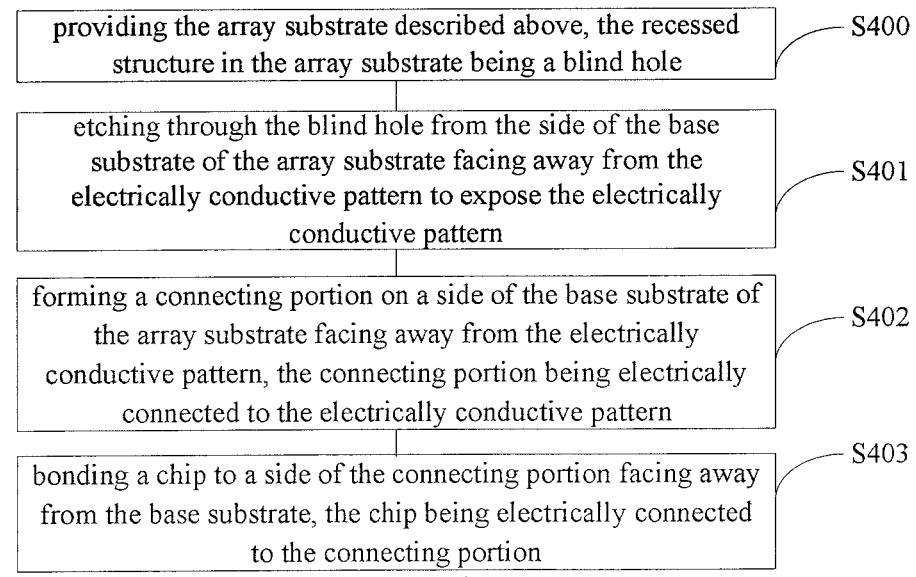
FIG. 15 is a schematic flow chart of a method for manufacturing a display device according to an embodiment of the present disclosure.

In an embodiment of the present disclosure, it further provides a method for manufacturing a display device, as shown in FIG. 15, the method includes:

S400: as shown in FIG. 1, providing the array substrate described above, the recessed structure 201 in the array substrate being a blind hole.

S401: as shown in FIG. 2, etching through the blind hole from the side of the base substrate 10 of the array substrate facing away from the electrically conductive pattern 30 to expose the electrically conductive pattern 30.

In some embodiments, the blind hole is etched through by dry etching to expose the electrically conductive pattern 30. In other embodiments, the blind hole is etched through by a hard mask in combination with a dry etching to expose the electrically conductive pattern 30.

S402: as shown in FIG. 3, forming a connecting portion 50 on a side of the base substrate 10 of the array substrate facing away from the electrically conductive pattern 30, the connecting portion 50 being electrically connected to the electrically conductive pattern 30.

Here, the material of the connecting portion 50 and the material of the electrically conductive pattern 30 may be the same or different, which is not limited.

S403: as shown in FIG. 4, bonding a chip 60 to a side of the connecting portion 50 facing away from the base substrate 10, the chip 60 being electrically connected to the connecting portion 50.

In some embodiments, after the step S400 and before the step S403, the method for manufacturing the display device further includes: forming a display panel. Specifically, in the case where the display device is a liquid crystal display device, the forming the display panel includes: assembling the array substrate and an opposite substrate and injecting liquid crystals between the array substrate and the opposite substrate to form the display panel. In the case where the display device is a Micro-LED display device, the forming the display panel includes: bonding Micro-LED particles to the array substrate. In the case where the display device is an organic electroluminescence display device, a quantum dot electroluminescence display device, or a quantum dot photoluminescence display device, the forming the display panel includes: forming a package layer on the array substrate. In some embodiments of the present disclosure, the forming the display panel is implemented after the step S400 and before the step S401.

In the embodiments of the present disclosure, it provides a method for manufacturing a display device. The method for manufacturing the display device has the same structure and beneficial effects as the array substrate provided in the above embodiments. Since the structure and beneficial effects of the array substrate have been described in detail in the above embodiments, they will not be described again here.

The method for manufacturing the display device provided by the embodiments of the present disclosure can be used to manufacture the above display device.

In the embodiments of the present disclosure, it provides an array substrate, a method for manufacturing an array substrate, a display device, a method for manufacturing a display device, and a spliced display device. The array substrate includes a base substrate and a filling portion. The base substrate is provided with a through hole, the filling portion is disposed in the through hole, and the filling portion includes a recessed structure. The array substrate further includes an electrically conductive pattern disposed on the filling portion, the electrically conductive pattern is at least partially located in the recessed structure, the material of the base substrate is a rigid material, and the material of the filling portion is a flexible material. In the manufacturing process of the array substrate, even the base substrate and the electrically conductive pattern are expanded under high temperature conditions, no gap is formed among the electrically conductive pattern, the filling portion and the base substrate since the material of the filling portion between the electrically conductive pattern and the base substrate is a flexible material. In addition, the through hole is entirely filled with an electrically conductive pattern for example copper in the related art, in contrast, in the embodiments of the present disclosure, the filling portion is disposed in the through hole, and the electrically conductive pattern is disposed on the recessed structure of the filling portion, thus the volume of the electrically conductive pattern in the embodiments of the present disclosure is smaller than that in the related art. Therefore, when the base substrate and the electrically conductive pattern are expanded under high temperature conditions, the step difference between the base substrate and the electrically conductive pattern is small. Based on the above, the embodiments of the present disclosure can reduce the risk of breakage of the film layer disposed on the electrically conductive pattern.

On this basis, the material of the base substrate in the embodiments of the present disclosure is a rigid material, thus it is unnecessary to dispose the base substrate on a rigid substrate and then strip it from the rigid substrate subsequently, and the chip is easily bonded to the back side of the array substrate (i.e., performing the bonding process), thereby avoiding the problem of significant difficulty of striping of the base substrate from a rigid substrate and the problem of significant difficulty of bonding process when the base substrate is made from a flexible material.

The above description only refers to the specific embodiments of the present disclosure, but the scope of the present disclosure is not limited thereto. Any changes or substitutions that are easily obtained by those skilled in the art within the technical scope of the present disclosure should fall within the scope of the present disclosure. Therefore, the scope of the present disclosure should be defined by the appended claims.

What is claimed is:

1. An array substrate, comprising:
   a base substrate in which a through hole is provided;
   a filling portion disposed in the through hole, comprising a recessed structure and made from a flexible material;
   an electrically conductive pattern disposed on the filling portion and at least partially located in the recessed structure;
   a film layer disposed on a side of the electrically conductive pattern facing away from the base substrate; and
   a connecting portion disposed on a side of the base substrate facing away from the electrically conductive pattern,
   wherein the connecting portion is electrically connected to the electrically conductive pattern; and
   wherein the connecting portion is located in the recessed structure to be electrically connected to the electrically conductive pattern.

2. The array substrate according to claim 1, wherein the base substrate is made from a rigid material.

3. The array substrate according to claim 1, wherein the recessed structure has a depth less than or equal to a thickness of the filling portion.

4. The array substrate according to claim 1, wherein
   the electrically conductive pattern is of a single-layer structure, and the electrically conductive pattern is made from copper; or
   the electrically conductive pattern is of a three-layer laminated structure, an intermediate layer of the three-layer laminated structure is made from aluminum, and other two layers on both sides of the intermediate layer are made from titanium.

5. The array substrate according to claim 2, wherein the rigid material is selected from glass, plastic, ceramic or quartz, and the flexible material is selected from poly-p-xylylene or polyimide.

6. A display device, comprising the array substrate according to claim 1,
   wherein the display device further comprises a chip disposed on a side of the connecting portion in the array substrate facing away from the base substrate, the chip being electrically connected to the connecting portion.

7. A spliced display device, comprising a plurality of the display devices according to claim 6.

8. A method for manufacturing a display device, comprising:
   providing the array substrate according to claim 1;
   bonding a chip to a side of a connecting portion facing away from the base substrate, and electrically connecting the chip to the connecting portion.

9. The method according to claim 8, wherein the recessed structure has a depth less than a thickness of the filling portion, and the method further comprises: etching through the recessed structure from a side of the base substrate of the array substrate facing away from the film layer to expose the electrically conductive pattern.

10. A method for manufacturing an array substrate, comprising:
    forming a through hole in a base substrate;
    filling a flexible material in the through hole, processing the flexible material filled in the through hole to form a filling portion, the filling portion comprising a recessed structure;
    forming an electrically conductive pattern on the filling portion, the electrically conductive pattern being at least partially located in the recessed structure;
    forming a film layer on a side of the electrically conductive pattern facing away from the base substrate; and
    forming a connecting portion on the side of the base substrate of the array substrate facing away from the electrically conductive pattern, wherein the connecting portion extending through the filling portion and being electrically connected. to the electrically conductive pattern.

11. The method according to claim 10, wherein the forming a through hole in the base substrate comprises:
    modifying a through hole region where a through hole is to be formed on the base substrate such that the through hole region is more easily etched by an etching solution than other regions on the base substrate; and
    placing the base substrate in the etching solution, and forming the through hole in the through hole region by etching using the etching solution.

12. The method according to claim 11, wherein, before placing the base substrate in the etching solution, the forming a through hole in the base substrate further comprises:
    forming an anti-etching protective film on a side of the base substrate.

13. The method according to claim 11, wherein the through hole region is irradiated by laser to modify the through hole region.

14. The method according to claim 10, wherein the forming a through hole in the base substrate comprises:
    forming an anti-etching protective film on at least one side of opposite sides of the base substrate in a region other than a through hole region where a through hole is to be formed; and
    placing the base substrate in an etching solution, and forming the through hole in the through hole region by etching using the etching solution.

15. The method according to claim 14, wherein, before placing the base substrate in the etching solution, the forming a through hole in the base substrate further comprises:
    modifying the through hole region on the base substrate such that the through hole region is more easily etched by the etching solution than other regions on the base substrate.

16. The method according to claim 10, wherein the forming an electrically conductive pattern on the filling portion comprises:

forming an electrically conductive film on the filling portion by sputtering, and patterning the electrically conductive film to form the electrically conductive pattern.

17. The method according to claim 10, wherein, after forming the electrically conductive pattern, the method further comprises removing the electrically conductive pattern outside the recessed structure by a chemical mechanical polishing process.

* * * * *